(12) United States Patent
Yim et al.

(10) Patent No.: US 9,966,132 B2
(45) Date of Patent: May 8, 2018

(54) METHOD FOR PROGRAMMING A NON-VOLATILE MEMORY DEVICE AND A METHOD FOR OPERATING A SYSTEM HAVING THE SAME

(71) Applicant: SAMSUNG ELECTRONICS CO., LTD., Suwon-si, Gyeonggi-do (KR)

(72) Inventors: Hye Jin Yim, Wonju-si (KR); Il Han Park, Suwon-si (KR); Hyun Kook Park, Anyang-si (KR); Sung Won Yun, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/478,679

(22) Filed: Apr. 4, 2017

(65) Prior Publication Data

US 2018/0102167 A1   Apr. 12, 2018

(30) Foreign Application Priority Data

Oct. 11, 2016 (KR) .......................... 10-2016-0131435

(51) Int. Cl.
| | | |
|---|---|---|
| *G11C 16/04* | (2006.01) | |
| *G11C 11/56* | (2006.01) | |
| *G11C 16/08* | (2006.01) | |
| *G11C 16/34* | (2006.01) | |

(52) U.S. Cl.
CPC ...... *G11C 11/5628* (2013.01); *G11C 11/5642* (2013.01); *G11C 16/08* (2013.01); *G11C 16/3459* (2013.01)

(58) Field of Classification Search
CPC ......... G11C 16/08; G11C 16/10; G11C 16/22; G11C 16/26; G11C 11/5628; G11C 11/5642; G11C 16/3459
USPC ............ 365/185.03, 185.18, 185.19, 185.22, 365/185.23, 185.24
See application file for complete search history.

(56) References Cited

U.S. PATENT DOCUMENTS

| | | | |
|---|---|---|---|
| 7,382,660 B2 | 6/2008 | Bovino et al. | |
| 7,403,422 B2 | 7/2008 | Kim et al. | |
| 7,701,768 B2 | 4/2010 | Hwang | |
| 8,259,497 B2 | 9/2012 | Shalvi et al. | |
| 9,036,417 B2 | 5/2015 | Chen et al. | |
| 9,236,135 B2 * | 1/2016 | Kamata | G11C 16/26 |
| 9,281,069 B2 | 3/2016 | Jang et al. | |
| 9,355,715 B1 | 5/2016 | Kim | |
| 2010/0246260 A1 * | 9/2010 | Kang | G11C 11/5621 365/185.03 |
| 2013/0033938 A1 | 2/2013 | Park et al. | |
| 2013/0088923 A1 * | 4/2013 | Kang | G11C 11/5621 365/185.19 |

(Continued)

*Primary Examiner* — Gene Auduong
(74) *Attorney, Agent, or Firm* — F. Chau & Associates, LLC

(57) ABSTRACT

A method for programming a non-volatile memory device includes programming a lower bit in a memory cell included in the non-volatile memory device, reading the lower bit programmed in the memory cell before programming an upper bit in the memory cell, determining a threshold voltage of the memory cell according to a result of reading the lower bit, determining a type of the memory cell using the threshold voltage, and supplying one of a plurality of pulses to a bit line connected to the memory cell according to the determined type of the memory cell.

20 Claims, 7 Drawing Sheets

(56) References Cited

U.S. PATENT DOCUMENTS

2015/0262691 A1* 9/2015 Kamata ................ G11C 16/26
365/185.22

* cited by examiner

METHOD FOR PROGRAMMING A NON-VOLATILE MEMORY DEVICE AND A METHOD FOR OPERATING A SYSTEM HAVING THE SAME

CROSS-REFERENCE TO RELATED APPLICATION

This application claims priority under 35 U.S.C. § 119 to Korean Patent Application No. 10-2016-0131435, filed on Oct. 11, 2016 in the Korean Intellectual Property Office, the disclosure of which is incorporated by reference herein in its entirety.

TECHNICAL FIELD

Exemplary embodiments of the present inventive concept relate to a method for programming a non-volatile memory device, and more particularly, to a method for, before programming an upper bit in a memory cell included in the non-volatile memory device, determining a type of the memory cell, supplying one of a plurality of pulses to a bit line connected to the memory cell according to the determined type of the memory cell, and programming the upper bit in the memory cell.

DISCUSSION OF RELATED ART

Semiconductor memory devices may be classified as either volatile memory devices or non-volatile memory devices depending on whether a continuous power supply is required to maintain data stored therein. A flash memory device is a type of non-volatile memory device, and is used in many electronic devices as a memory device capable of electrically programming and erasing data.

SUMMARY

According to an exemplary embodiment of the present inventive concept, a method for programming a non-volatile memory device includes programming a lower bit in a memory cell included in the non-volatile memory device, reading the lower bit programmed in the memory cell before programming an upper bit in the memory cell, determining a threshold voltage of the memory cell according to a result of reading the lower bit, determining a type of the memory cell using the threshold voltage, and supplying one of a plurality of pulses to a bit line connected to the memory cell according to the determined type of the memory cell.

According to an exemplary embodiment of the present inventive concept, in a method of operating a memory system including a controller and a non-volatile memory device configured to perform a programming operation according to a control of the controller, the method includes programming, by the non-volatile memory device, a lower bit in a memory cell included in the non-volatile memory device, reading, by the non-volatile memory device, the lower bit programmed in the memory cell before programming an upper bit in the memory cell, determining, by the non-volatile memory device, a threshold voltage of the memory cell according to a result of reading the lower bit, determining, by the non-volatile memory device, a type of the memory cell using the threshold voltage, and supplying, by the non-volatile memory device, one of a plurality of pulses to a bit line connected to the memory cell according to the determined type of the memory cell.

According to an exemplary embodiment of the present inventive concept, a method for programming a non-volatile memory device includes programming a lower bit in a memory cell included in the non-volatile memory device, reading the lower bit programmed in the memory cell before programming an upper bit in the memory cell, determining a threshold voltage of the memory cell according to a result of reading the lower bit, determining whether the memory cell is one of a first type cell, a second type cell, or a third type cell using the threshold voltage, transmitting a pulse sequence comprising a first pulse, a second pulse, and a third pulse, and supplying, to a bit line connected to the memory cell, the first pulse if the memory cell is the first type cell, the second pulse if the memory cell is the second type cell, and the third pulse if the memory cell is the third type cell. A first threshold voltage of the first type cell is higher than a second threshold voltage of the second type cell, and the second threshold voltage of the second type cell is higher than a third threshold voltage of the third type cell.

BRIEF DESCRIPTION OF THE DRAWINGS

The above and other features of the present inventive concept will become apparent and more readily appreciated by describing in detail exemplary embodiments thereof with reference to the accompanying drawings.

DETAILED DESCRIPTION OF THE EMBODIMENTS

Figure 1:
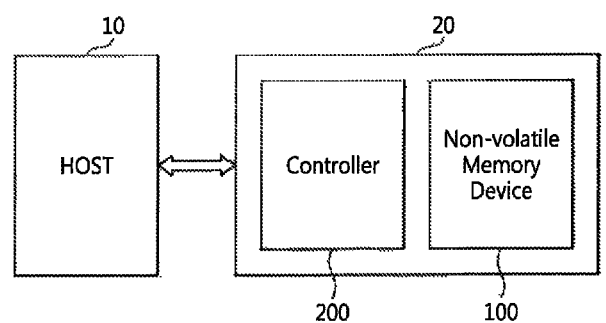
FIG. 1 illustrates a host and a memory system according to an exemplary embodiment of the present inventive concept.

Exemplary embodiments of the present inventive concept will be described more fully hereinafter with reference to the accompanying drawings. Like reference numerals may refer to like elements throughout this application.

FIG. 1 illustrates a host and a memory system according to an exemplary embodiment of the present inventive concept. Referring to FIG. 1, a memory system 20 connected to a host 10 includes a memory controller 200 and a non-volatile memory device 100.

According to an exemplary embodiment of the present inventive concept, the memory system 20 may be a memory card, a memory drive, a solid-state drive (SSD), or a managed NAND. The memory card may be a secure digital (SD) card, a multimedia card (MMC), an embedded MMC (eMMC), a universal flash storage (UFS), or the like. The memory drive may be a universal serial bus (USB) flash drive or a memory stick. The managed NAND may refer to a controller-embedded NAND chip.

The memory system 20 may refer to various memory systems that include the non-volatile memory device 100, which will be further described below. For example, the memory controller 200 and the non-volatile memory device 100 may be packaged in separate packages or in one package together.

A mobile computing device (or a handheld electronic device) may include the host 10 and the memory system 20. The mobile computing device (or handheld electronic device) may be a laptop computer, a smart phone, an internet of things (IoT) device, an internet of everything (IoE) device, or a mobile internet device (MID). An electronic system including the host 10 and the memory system 20 may be used not only in a personal computer (PC), a database, a server, a data center, or an internet data center but also in an automobile system, a smart car, a home automation system, or the like.

According to an exemplary embodiment of the present inventive concept, the non-volatile memory device 100 may be a NAND flash memory device. The non-volatile memory device 100 may have a multilevel cell (MLC) structure for storing 2 bits or more of information (or data) in one memory cell.

The memory controller 200 may generate an address and a command (for example, a program command, a read command, or an erase command) for controlling an operation (for example, a programming operation, a read operation, or an erase operation) of the non-volatile memory device 100 according to a control of the host 10.

The programming operation and the read operation are performed by page and the erase operation is performed by block. The memory controller 200 may output a command to the non-volatile memory device 100 for controlling operations of the non-volatile memory device 100.

The non-volatile memory device 100 may perform an operation according to the command, and transmit a result of the operation to the memory controller 200.

Figure 2:
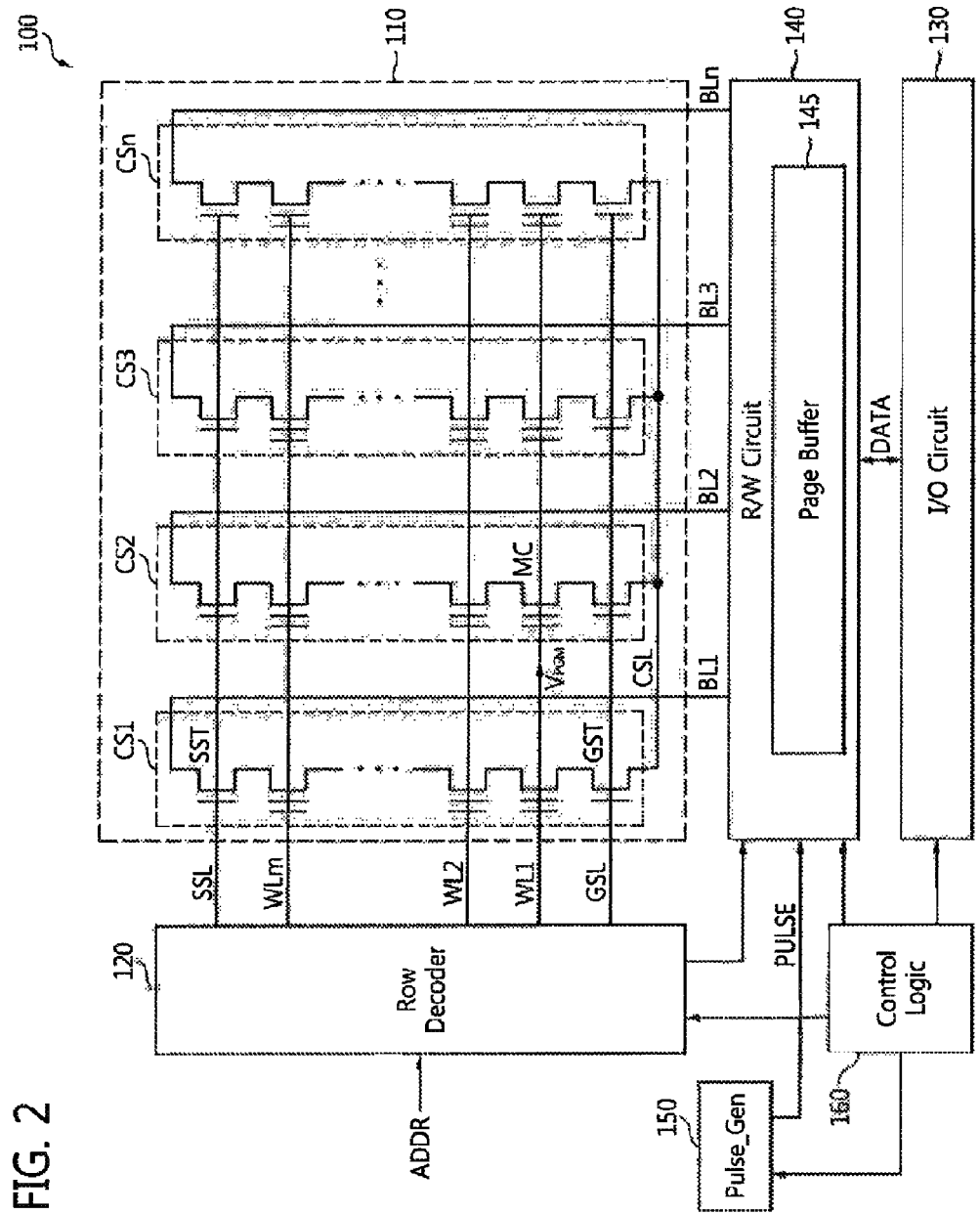
FIG. 2 illustrates a non-volatile memory device of FIG. 1 according to an exemplary embodiment of the present inventive concept.

FIG. 2 illustrates a non-volatile memory device of FIG. 1 according to an exemplary embodiment of the present inventive concept. Referring to FIGS. 1 and 2, the non-volatile memory device 100 according to an exemplary embodiment of the present inventive concept includes a memory cell array 110, a row decoder (or a row driver) 120, a data input/output (I/O) circuit 130, a read/write (R/W) circuit 140, a pulse generator 150, and a control logic (or a control logic circuit) 160.

The memory cell array 110 is connected to the row decoder 120 through a string selection line (SSL), word lines WL1 to WLm (where m is a natural number of two or more), and a ground selection line (GSL), and is connected to the read/write circuit 140 through bit lines BL1 to BLn (where n is a natural number of two or more).

The memory cell array 110 includes a plurality of cell strings CS1 to CSn. Each of the plurality of cell strings CS1 to CSn includes a plurality of memory cells. Each of the plurality of memory cells has a structure for storing a single bit, or storing 2 bits or more of data.

Although it is shown that the memory cell array 110 has a two-dimensional structure in FIG. 2, the inventive concept is not limited thereto and the memory cell array 110 may include a three-dimensional memory cell array.

In an exemplary embodiment of the present inventive concept, a three dimensional (3D) memory array may be provided. The 3D memory array is monolithically formed in one or more physical levels of arrays of memory cells having an active area disposed above a silicon substrate and circuitry associated with the operation of these memory cells, regardless of whether such associated circuitry is above or within the silicon substrate. In other words, layers of each level of the array are directly deposited on the layers of an underlying level.

In an exemplary embodiment of the present inventive concept, the 3D memory array includes vertical NAND strings that are vertically oriented such that at least one memory cell is disposed over another memory cell. The at least one memory cell may include a charge trap layer.

Each of the plurality of cell strings CS1 to CSn includes a string selection transistor (SST), a plurality of memory cells MC, and a ground selection transistor (GST). Each of the string selection transistors SST is connected to one of the bit lines BL1 to BLn, and each of the ground selection transistors GST is connected to a common source line (CSL). For example, a first string selection transistor is connected to a first bit line BL1 and a first ground selection transistor is connected to the common source line CSL in a first cell string CS1.

A gate of each memory cell MC is connected to one of the word lines WL1 to WLm, a gate of each of the string selection transistors SST is connected to the string selection line SSL, and a gate of each of the ground selection transistors GST is connected to the ground selection line GSL.

For example, when each memory cell MC of the memory cell array 110 is a single level cell (SLC) for storing one bit of data, each of the word lines WL1 to WLm may be defined by one page. Here, a page may refer to a memory region corresponding to a plurality of memory cells connected to one word line. The page may also refer to a set of data to be stored in the memory region.

According to an exemplary embodiment of the present inventive concept, when each memory cell MC is an MLC for storing 2 bits or more of data, one word line may have a number of pages equal to the number of bits programmed in each of a plurality of MLCs connected to the one word line.

For example, when each of the plurality of MLCs is stores 2 bits of data, one word line includes two pages (for example, a first page and a second page). The first page may be referred to as a least significant bit (LSB) page, and the second page may be referred to as a most significant bit (MSB) page.

Moreover, when each of the plurality of MLCs stores 3 bits of data (in this case, the MLC refers to a triple level cell (TLC)), one word line may include three pages (for example, a first page, a second page, and a third page). The first page, the second page, and the third page may refer to a least significant bit (LSB) page, a center significant bit (CSB) page, and a most significant bit (MSB) page, respectively. As described above, each page may refer to a set of data stored in a memory region defined by each of the pages.

The row decoder 120 is connected to the memory cell array 110, the read/write circuit 140, and the control logic circuit 160. According to an exemplary embodiment of the present inventive concept, the row decoder 120 may operate according to a control of the control logic circuit 160.

The row decoder 120 may receive an address ADDR input from the outside (e.g., from the memory controller 200 of FIG. 1). According to an exemplary embodiment of the present inventive concept, the row decoder 120 may decode a column address included in the address ADDR and supply a plurality of column selection signals generated according to a decoding result to the read/write circuit 140. According to an exemplary embodiment of the present inventive concept, the row decoder 120 may decode a row address included in the address ADDR and select each of the word lines WL1 to WLm using a plurality of row selection signals generated according to a decoding result. The row decoder 120 may collectively represent a column decoder for generating the column selection signals and a row decoder for generating the row selection signals.

The data input/output circuit 130 may transmit or receive data DATA to or from the read/write circuit 140. According to an exemplary embodiment of the present inventive concept, the data input/output circuit 130 may operate according to a control of the control logic circuit 160.

The data input/output circuit 130 may transmit data DATA received from the read/write circuit 140 to the outside, and may transmit data DATA received from the outside to the read/write circuit 140.

The read/write circuit 140 may include a page buffer 145. It is shown that the read/write circuit 140 includes one page buffer 145 in FIG. 2, but the number of page buffers included in the read/write circuit 140 may be variously changed according to exemplary embodiments of the present inventive concept.

The read/write circuit 140 may select the bit lines BL1 to BLn in response to the column selection signal supplied from the row decoder 120. The read/write circuit 140 may program (or write) data DATA, transmitted from the data input/output circuit 130, in selected memory cells corresponding to the selected bit lines BL1 to BLn.

The read/write circuit 140 may read data stored in the selected memory cells, and transmit read data to the data input/output circuit 130. For example, the read/write circuit 140 may read the data stored in the memory cells using different read voltages at different time points, and transmit the read data to the data input/output circuit 130.

During a read operation, the read/write circuit 140 may operate as a sense amplifier for sensing and amplifying a voltage level of each of the plurality of bit lines BL1 to BLn included in the memory cell array 110 according to a control of the control logic circuit 160.

The page buffer 145 may receive and store read data from the memory cell array 110.

The page buffer 145 may transmit pulses PULSE received from the pulse generator 150 to each of the bit lines BL1 to BLn.

The pulse generator 150 may generate voltages (e.g., the pulses PULSE) for operations of the non-volatile memory device 100, and transmit the generated voltages (pulses) to the read/write circuit 140. According to an exemplary embodiment of the present inventive concept, the pulse generator 150 may transmit the generated voltages (pulses) to the page buffer 145. Although the pulse generator 150 for generating pulses is exemplarily shown in FIG. 2, the pulse generator 150 may be replaced with a voltage generator for generating voltages for the programming operation, voltages for the read operation, or voltages for the erase operation, and thus, the voltage generator may generate the pulses according to exemplary embodiments of the present inventive concept.

The control logic circuit 160 may control overall operations of the row decoder 120, the data input/output circuit 130, the read/write circuit 140, and the pulse generator 150 based on commands output from the memory controller 200 of FIG. 1.

Figure 3:
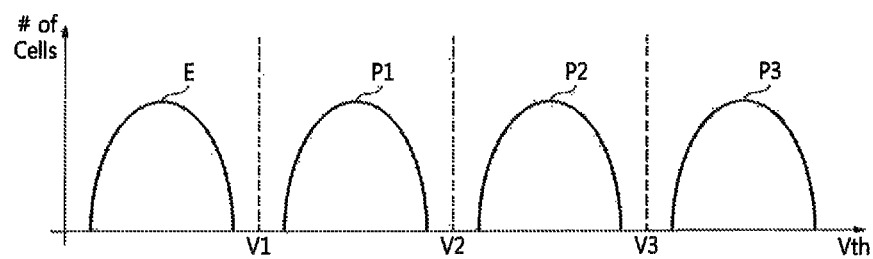
FIG. 3 illustrates a threshold voltage spread or distribution of memory cells of the non-volatile memory device of FIG. 1 according to an exemplary embodiment of the present inventive concept.

FIG. 3 illustrates a threshold voltage spread or distribution of memory cells of the non-volatile memory device of FIG. 1 according to an exemplary embodiment of the present inventive concept. Referring to FIGS. 2 and 3, an X-axis (or a horizontal axis) represents a threshold voltage (Vth) of each memory cell MC included in the memory cell array 110, and a Y-axis (or a vertical axis) represents the number of memory cells MC corresponding to each threshold voltage (Vth).

A memory cell for storing k bits may have $2^k$ states. For example, a memory cell for storing 2 bits may have $2^2=4$ states as shown in FIG. 3. Each state may be classified into an erase state (E), a first programmed state (P1), a second programmed state (P2), and a third programmed state (P3) according to a distribution of the threshold voltage Vth. The states E, P1, P2, and P3 are classified by reference voltages (V1, V2, and V3).

A state of a memory cell may be represented by a bit programmed in the memory cell. Assuming that, for example, a state of not being programmed is represented by a bit "1" and a state of being programmed is represented by a bit "0", then, the erase state E may be represented by "11", the first programmed state P1 may be represented by "01", the second programmed state P2 may be represented by "10", and the third programmed state P3 may be represented by "00". For example, LSB in the erase state E and the first programmed state P1 is "1".

A method for programming a non-volatile memory device, according to an exemplary embodiment of the present inventive concept, consists of an operation of programming a lower bit (for example, LSB) and an operation of programming an upper bit (for example, MSB). For example, the upper bit is programmed in the memory cell MC after the lower bit is programmed in the memory cell MC. The upper bit and the lower bit may refer to two successive bits, but the inventive concept is not limited thereto.

Figure 4:
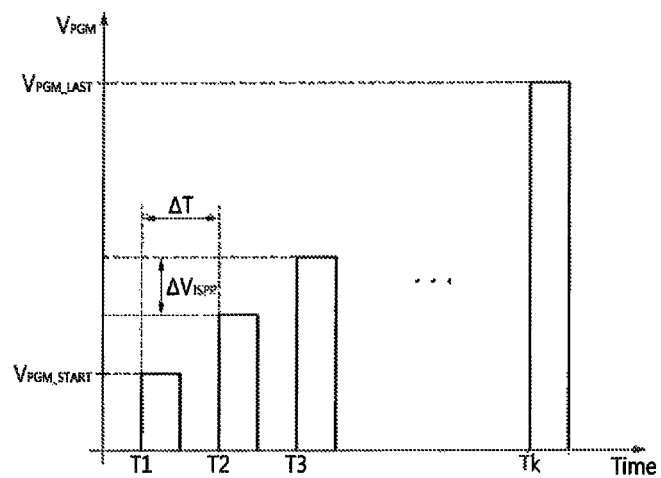
FIG. 4 illustrates programming voltages generated according to an incremental step pulse program (ISPP) according to an exemplary embodiment of the present inventive concept.

FIG. 4 illustrates programming voltages generated according to an incremental step pulse program (ISPP) according to an exemplary embodiment of the present inventive concept. An X-axis represents time and a Y-axis represents a programming voltage $V_{PGM}$ in a graph of FIG. 4.

Referring to FIGS. 2 and 4, the non-volatile memory device 100 may program the memory cell MC. According to an exemplary embodiment of the present inventive concept, the non-volatile memory device 100 may program the lower bit in the memory cell MC and then program the upper bit in the memory cell MC.

The non-volatile memory device 100 may supply the programming voltage $V_{PGM}$ to a first word line WL1 connected to the memory cell MC to program the memory cell MC. According to an exemplary embodiment of the present inventive concept, the non-volatile memory device 100 can supply the programming voltage $V_{PGM}$ to the word line WL1 a plurality of times. For example, the non-volatile memory device 100 may supply the programming voltage $V_{PGM}$ for programming the memory cell MC "1" times, where 1 is a natural number of one or more.

The programming voltage $V_{PGM}$ may be determined according to a programming condition of the non-volatile memory device 100. According to an exemplary embodiment of the present inventive concept, the programming voltage $V_{PGM}$ may increase whenever the number of programming times of the non-volatile memory device 100 increases.

Programming by the non-volatile memory device 100 starts when a programming start voltage $V_{PGM\_START}$ is supplied, and the programming ends when a programming end voltage $V_{PGM\_LAST}$ is supplied. According to exemplary embodiments of the present inventive concept, when the programming start voltage $V_{PGM\_START}$ begins to be supplied is the start of programming the upper bit.

When a level of the programming voltage $V_{PGM}$ is determined according to ISPP, the programming voltage $V_{PGM}$ may increment by a fixed value ($\Delta V_{ISPP}$), from the programming start voltage $V_{PGM\_START}$ to the programming end voltage $V_{PGM\_LAST}$, at set points in time from T1 to Tk. In other words, the programming voltage $V_{PGM}$ is the programming start voltage $V_{PGM\_START}$ at T1 and the programming end voltage $V_{PGM\_LAST}$ at Tk.

As a programming operation by the non-volatile memory device 100 proceeds, the programming voltage $V_{PGM}$ increases by $\Delta V_{1s}pp$. For example, when the programming start voltage $V_{PGM\_START}$ is 1V and $\Delta V_{ISPP}$ is 0.3V, the programming voltage $V_{PGM}$ may constantly increase, e.g., 1V, 1.3V, 1.6V, . . . , and so forth.

Performance in the programming operation by the non-volatile memory device 100 may be measured by time consumed in the programming operation. For example, time consumed in the programming operation may be determined by multiplication of the number of program loops of the programming operation and time (for example, $\Delta T=T_2-T_1$) consumed to perform the program loop. The program loop refers to the number of times ($=(V_{PGM\_LAST}-V_{PGM\_START})/\Delta V_{ISPP}$) (e.g., k-1) the programming voltage $V_{PGM}$ increases until the programming operation is completed.

As time consumed in the programming operation by the non-volatile memory device 100 decreases, performance in the programming operation increases. For example, if the programming start voltage $V_{PGM\_START}$ of the non-volatile memory device 100 increases, the number of the program loops decreases, and thus, a programming performance of the non-volatile memory device 100 can be increased.

Although the programming voltage $V_{PGM}$ is determined according to ISPP in FIG. 4, the present inventive concept is not limited thereto.

Figure 5:
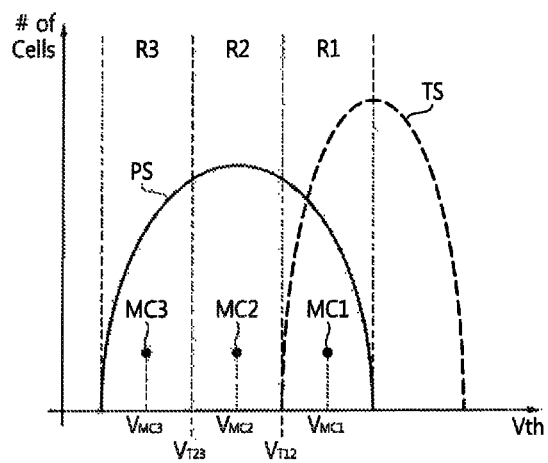
FIG. 5 illustrates determining a type of a memory cell in a method for programming a non-volatile memory device according to an exemplary embodiment of the present inventive concept.

FIG. 5 illustrates determining a type of a memory cell in a method for programming a non-volatile memory device according to an exemplary embodiment of the present inventive concept. Current distribution PS shown in FIG. 5 represents a distribution of threshold voltages of memory cells to be programmed, and target distribution TS represents a distribution of threshold voltages of programmed memory cells. According to an exemplary embodiment of the present inventive concept, the target distribution TS may refer to the first programmed state P1 shown in FIG. 3; however, the inventive concept is not limited thereto.

Referring to FIGS. 2 and 5, the non-volatile memory device 100 may determine a threshold voltage of the memory cell MC.

The non-volatile memory device 100 may determine the threshold voltage of the memory cell MC according to a result of reading a lower bit programmed in the memory cell MC before programming an upper bit in the memory cell MC. According to an exemplary embodiment of the present inventive concept, a read operation for the same memory cell MC may be performed once or a plurality of times.

The non-volatile memory device 100 may determine whether the lower bit programmed in the memory cell MC is a first value (for example, "1", logic "1", or data "1") or a second value (for example, "0", logic "0", or data "0").

For example, assuming the memory cell MC has the threshold voltage distribution shown in FIG. 3, when the threshold voltage of the memory cell MC is greater than the second reference voltage V2, the LSB of the memory cell MC may be determined as "0", and when the threshold voltage of the memory cell MC is less than the second reference voltage V2, the LSB of the memory cell MC may be determined as "1".

According to an exemplary embodiment of the present inventive concept, the non-volatile memory device 100 may measure the threshold voltage of the same memory cell MC a plurality of times. For example, the non-volatile memory device 100 may measure the threshold voltage of the memory cell MC twice. For example, when the threshold voltage of the memory cell having the threshold voltage distribution shown in FIG. 3 is determined to be greater than the second reference voltage V2, the non-volatile memory device 100 may determine whether the threshold voltage of the memory cell MC is greater than the third reference voltage V3.

According to an exemplary embodiment of the present inventive concept, the non-volatile memory device 100 may supply different verification voltages (for example, read verification voltages) to a memory cell and measure threshold voltages of the memory cell. For example, the non-volatile memory device 100 may sequentially supply a plurality of verification voltages to a memory cell and sequentially measure threshold voltages of the memory cell a plurality of times.

According to an exemplary embodiment of the present inventive concept, the non-volatile memory device 100 may supply a verification voltage to a memory cell and measure a threshold voltage of the memory cell at different time points. For example, the non-volatile memory device 100 may measure a threshold voltage of the memory cell a plurality of times at fixed time intervals.

The non-volatile memory device 100 may supply different verification voltages or the same verification voltage to a memory cell at different time points, determine or measure a threshold voltage (or threshold voltages) of the memory cell, and decide (or determine) a type of the memory cell according to a result of the determination.

A type of the memory cell may be divided into a first type cell MC1, a second type cell MC2, and a third type cell MC3 according to the threshold voltage (or threshold voltages) of the memory cell. The first type cell MC1 is a memory cell belonging to a first region R1, the second type cell MC2 is a memory cell belonging to a second region R2, and the third type cell MC3 is a memory cell belonging to a third region R3.

The first region R1 and the second region R2 are divided by a threshold voltage $V_{T12}$, and the second region R2 and the third region R3 are divided by a threshold voltage $V_{T23}$. As shown in FIG. 5, a first threshold voltage $V_{MC1}$ of the first type cell MC1 is higher than a second threshold voltage $V_{MC2}$ of the second type cell MC2, and the second threshold voltage $V_{MC2}$ of the second type cell MC2 is higher than a third threshold voltage $V_{MC3}$ of the third type cell MC3.

For example, the first type cell MC1 may be a memory cell already programmed to have the target distribution TS, and each of the second type cell MC2 and the third type cell MC3 may be a memory cell to be programmed to have the target distribution TS.

In particular, since the second threshold voltage $V_{MC2}$ of the second type cell MC2 is higher than the third threshold voltage $V_{MC3}$ of the third type cell MC3, if a variation amount of the second threshold voltage $V_{MC2}$ is set to be less than a variation amount of the third threshold voltage $V_{MC3}$, the target distribution TS may appear relatively dense.

For example, the first type cell MC1 may be a memory cell which is not programmed, and each of the second type cell MC2 and the third memory cell MC3 may be a memory cell which is programmed.

The non-volatile memory device 100, e.g., the control logic circuit 160 therein, may determine whether a memory cell is the first type cell MC1, the second type cell MC2, or the third type cell MC3. For example, the non-volatile memory device 100 according to an exemplary embodiment of the present inventive concept may read a lower bit programmed in the memory cell MC at least once, and determine the type of the memory cell MC before programming an upper bit in the memory cell MC according to a result of the determination.

According to an exemplary embodiment of the present inventive concept, operations to determine a type of a memory cell, described with reference to FIG. 5, may be performed before the upper bit is programmed in the memory cell.

Figure 6:
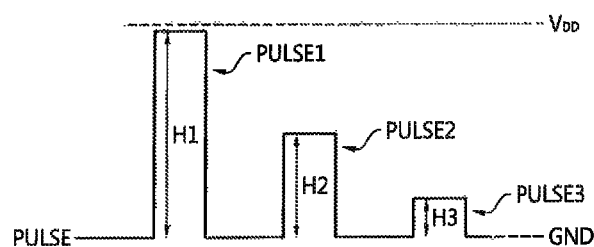
FIG. 6 illustrates pulses supplied to a memory cell in the method for programming a non-volatile memory device according to an exemplary embodiment of the present inventive concept.

FIG. 6 illustrates pulses supplied to a memory cell in the method for programming a non-volatile memory device according to an exemplary embodiment of the present inventive concept. Referring to FIGS. 2 and 6, the non-volatile memory device 100 may supply the pulse PULSE to the bit lines BL1 to BLn. Here, the pulse PULSE may refer to a pulse sequence including two pulses having different amplitudes and/or phases. The pulse generator 150 (or a voltage generator) may generate the pulse sequence and supply the generated pulse sequence to the read/write circuit 140. The read/write circuit 140 may supply the pulse sequence to each of the bit lines BL1 to BLn.

According to an exemplary embodiment of the present inventive concept, the pulse sequence may include at least two of a first pulse PULSE1, a second pulse PULSE2, and a third pulse PULSE3. For example, as shown in FIG. 6, the pulse generator 150 may generate the first pulse PULSE1, the second pulse PULSE2, and the third pulse PULSE3.

The first to third pulses PULSE1 to PULSE3 may have different heights or amplitudes, e.g., first to third heights H1 to H3, respectively.

The first height H1 of the first pulse PULSE1 may be higher than the second height H2 of the second pulse PULSE2, and the second height H2 of the second pulse PULSE2 may be higher than the third height H3 of the third pulse PULSE3. For example, the first height H1 may be substantially the same as an amplitude or level of a power voltage $V_{DD}$, the second height H2 may correspond to half of the amplitude of the power voltage $V_{DD}$, and the third height H3 may be higher than an amplitude or level of a ground voltage GND and lower than the second height H2. However, the inventive concept is not limited thereto.

For example, when the second height H2 of the second pulse PULSE2 is lower than the power voltage $V_{DD}$ and higher than the ground voltage GND, the second pulse PULSE2 may be referred to as a pulse (or voltage) for bit line forcing.

The pulse generator 150 may periodically generate the pulse sequence (e.g., the pulse PULSE). For example, the pulse generator 150 may sequentially generate the first pulse PULSE1, the second pulse PULSE2, and the third pulse PULSE3 at fixed intervals.

Although three pulses (e.g., PULSE1 to PULSE3) are shown in FIG. 6, the number of pulses included in the pulse PULSE may be variously changed and the amplitude and/or the phase of each of the pulses may be variously changed, according to exemplary embodiments of the present inventive concept.

Figure 7A:
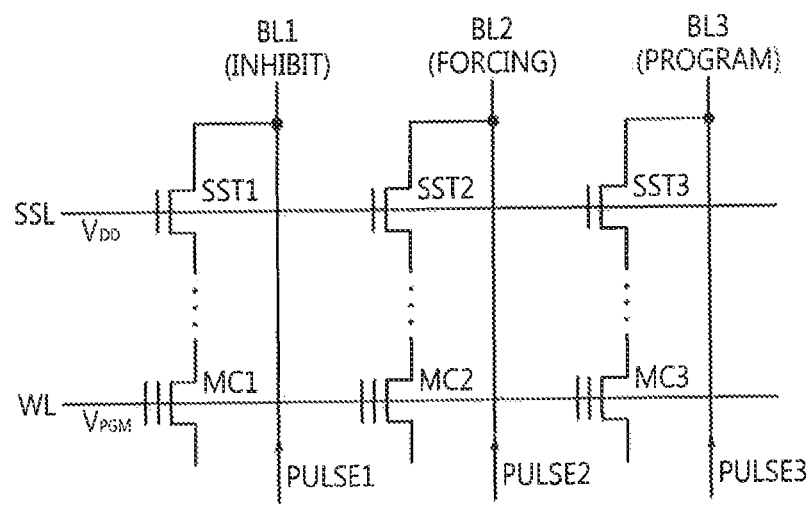
FIGS. 7A and 7B are circuit diagrams to illustrate supplying of pulses to memory cells in the method for programming a non-volatile memory device according to an exemplary embodiment of the present inventive concept.
Figure 7B:
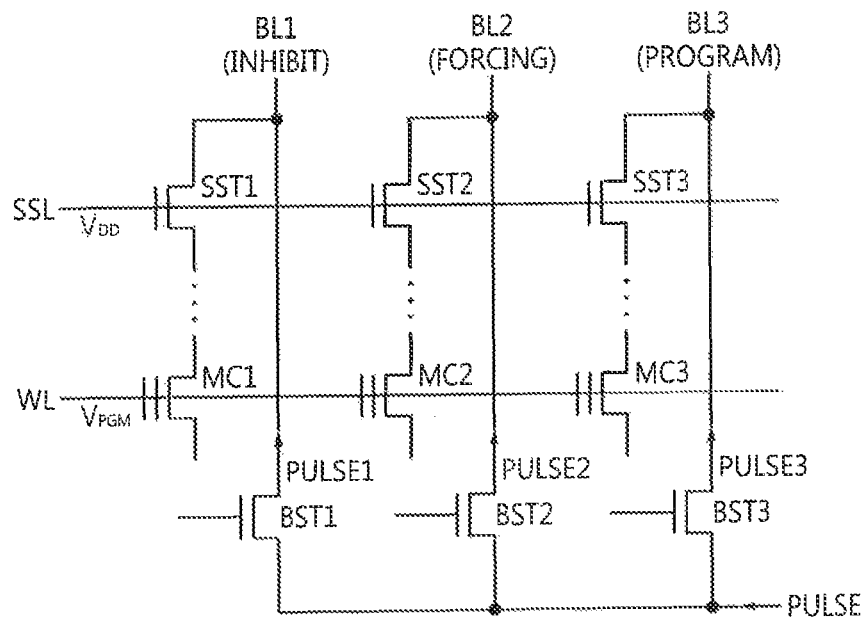

FIGS. 7A and 7B are circuit diagrams to illustrate supplying of pulses to memory cells in the method for programming a non-volatile memory device according to an exemplary embodiment of the present inventive concept.

Referring to FIGS. 5 to 7A, the non-volatile memory device 100 may supply the first pulse PULSE1 of the pulse PULSE to the first bit line BL1 connected to the first type cell MC1, supply the second pulse PULSE2 of the pulse PULSE to the second bit line BL2 connected to the second type cell MC2, and supply the third pulse PULSE3 of the pulse PULSE to the third bit line BL3 connected to the third type cell MC3.

According to an exemplary embodiment of the present inventive concept, each of bit line selection transistors BST1 to BST3 may be connected to each of the bit lines BL1 to BL3, as shown in FIG. 7B. Each of the bit line selection transistors BST1 to BST3 may adjust a voltage supplied to each of the bit lines BL1 to BL3.

According to an exemplary embodiment of the present inventive concept, the bit line selection transistors BST1 to BST3 may adjust an amplitude of a voltage supplied to the bit lines BL1 to BL3, respectively, and when a plurality of voltages are supplied to each of the bit lines BL1 to BL3, each of the bit line selection transistors BST1 to BST3 may select at least one of the plurality of voltages and supply the selected voltage to its corresponding bit line.

For example, when the pulse sequence (e.g., the pulse PULSE) shown in FIG. 6 is supplied to each of the bit lines BL1 to BL3, the first bit line selection transistor BST1 may supply only the first pulse PULSE1 to the first bit line BL1 in response to a first control signal, the second bit line selection transistor BST2 may supply only the second pulse PULSE2 to the second bit line BL2 in response to a second control signal, and the third bit line selection transistor BST3 may supply only the third pulse PULSE3 to the third bit line BL3 in response to a third control signal. For example, each of the first to third control signals may be generated by the control logic circuit 160 based on a type (MC1, MC2, or MC3) of each memory cell.

When the first pulse PULSE1 shown in FIG. 6 is supplied to the first bit line BL1, a gate-source voltage of a first string selection transistor SST1 of the first bit line BL1 does not reach a threshold voltage, and the first string selection transistor SST1 is turned off. For example, the first type cell MC1 is set as program inhibit INHIBIT.

When the third pulse PULSE3 shown in FIG. 6 is supplied to the third bit line BL3, a gate-source voltage of a third string selection transistor SST3 of the third bit line BL3 reaches a threshold voltage, and the third string selection transistor SST3 is turned on. For example, the third type cell MC3 is set as program PROGRAM.

When the second pulse PULSE2 shown in FIG. 6 is supplied to the second bit line BL2, a gate-source voltage of a second string selection transistor SST2 reaches a threshold voltage, and the second string selection transistor SST2 is turned on. The second type cell MC2 is programmed by the programming voltage $V_{PGM}$. Unlike the third bit line BL3, effects of the programming voltage $V_{PGM}$ on the second type cell MC2 may decrease by the second pulse PULSE2.

For example, a voltage difference is generated between a channel of the second type cell MC2 and a gate of the second type cell MC2 by the second pulse PULSE2. Since effects of the programming voltage $V_{PGM}$ on the second type cell MC2 may decrease, changes in the threshold voltage of the second type cell MC2 may be less than changes in the threshold voltage of the third type cell MC3 after the programming operation. For example, the second type cell MC2 is set as program forcing FORCING.

In the method for programming the non-volatile memory device 100 according to exemplary embodiments of the present inventive concept, because changes in the threshold voltage of the second type cell MC2 may be less than changes in the threshold voltage of the third type cell MC3, the programming start voltage $V_{PGM\_START}$ supplied to each word line may increase. Accordingly, performance in the programming operation by the non-volatile memory device 100 may be increased.

Figure 8A:
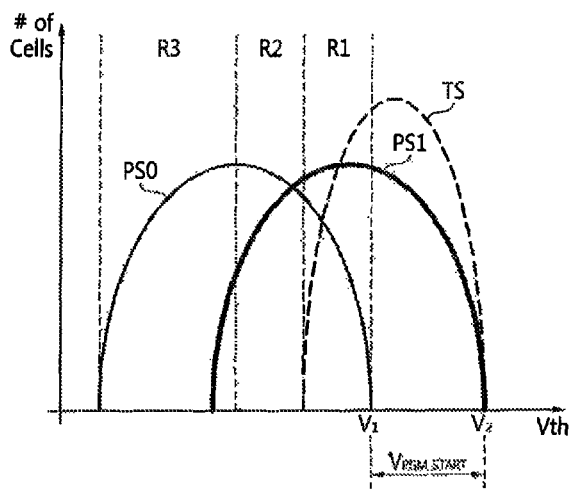
FIG. 8A illustrates a case in which an upper bit is programmed in a memory cell without using the method for programming a non-volatile memory device according to an exemplary embodiment of the present inventive concept.

FIG. 8A illustrates a case in which an upper bit is programmed in a memory cell without using the method for programming a non-volatile memory device according to an exemplary embodiment of the present inventive concept.

Figure 8B:
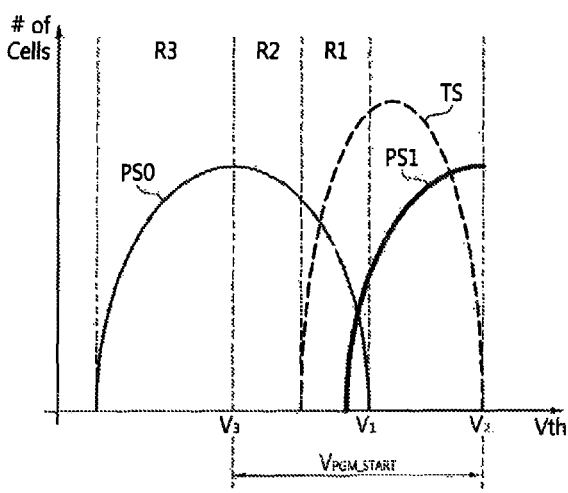
FIG. 8B illustrates a case in which the upper bit is programmed in the memory cell using the method for programming a non-volatile memory device according to an exemplary embodiment of the present inventive concept.

FIG. 8B illustrates a case in which the upper bit is programmed in the memory cell using the method for programming a non-volatile memory device according to an exemplary embodiment of the present inventive concept.

Referring to FIG. 8A, a distribution before programming PS0 represents a distribution of threshold voltages of memory cells before the upper bit is programmed, and a distribution after the programming PS1 represents a distribution of the threshold voltages of the memory cells after the upper bit is programmed. The target distribution TS refers to a distribution of threshold voltages which are targeted by the programming of the upper bit.

Since a maximum value of threshold voltages of memory cells belonging to the target distribution TS is $V_2$ and a maximum value of threshold voltages of memory cells belonging to the distribution before programming PS0 is $V_1$, an allowable (or acceptable) programming start voltage $V_{PGM\_START}$ is $V_2-V_1$.

Referring to FIGS. 7A, 7B, and 8B, the maximum value of threshold voltages of the memory cells belonging to the target distribution TS is $V_2$, and the maximum value of threshold voltages of the memory cells belonging to the distribution before programming PS0 is $V_1$.

According to the method for programming the non-volatile memory device 100 according to an exemplary embodiment of the present inventive concept, since the first pulse PULSE1 of the pulse PULSE is supplied to bit lines connected to memory cells included in the first region R1 before upper bits are programmed, the memory cells included in the first region R1 are set as program inhibit INHIBIT.

Since the second pulse PULSE2 of the pulse PULSE is supplied to bit lines connected to memory cells included in the second region R2, the memory cells included in the second region R2 may be set as program forcing FORCING.

As a result, since changes in threshold voltage of memory cells included in the second region R2 are set to be less than changes in threshold voltage of memory cells included in the third region R3 in the method for programming the non-volatile memory device 100 according to an exemplary embodiment of the present inventive concept, the allowable programming start voltage $V_{PGM\_START}$ is $V_3-V_1$.

The programming start voltage $V_{PGM\_START}$, which is $V_3-V_1$ in FIG. 8B, is greater than the programming start voltage $V_{PGM\_START}$, which is $V_2-V_1$ in FIG. 8A. Accordingly, in accordance with the above-described method for programming the non-volatile memory device 100, the allowable programming start voltage $V_{PGM\_START}$ can increase. As a result, time consumed to program an upper bit in a memory cell is reduced, and thus, performance in the programming operation by the non-volatile memory device 100 is increased.

Figure 9:
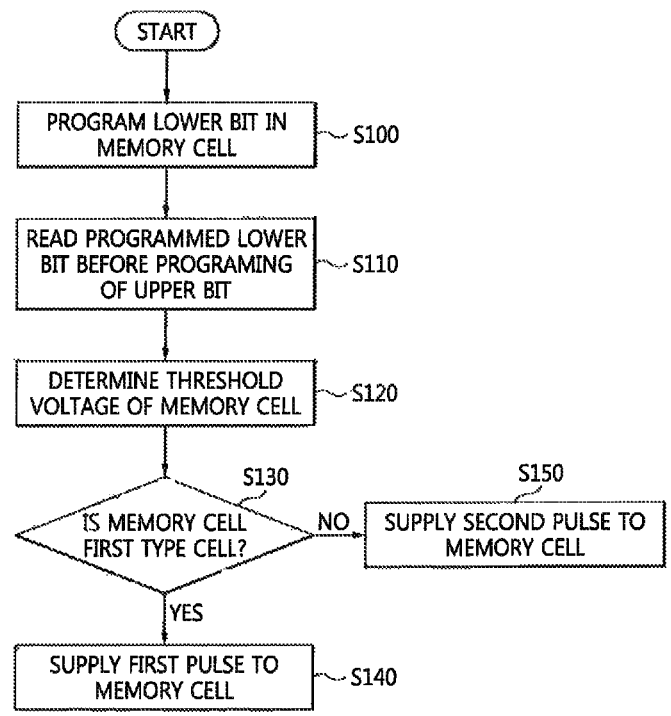
FIG. 9 is a flowchart illustrating the method for programming a non-volatile memory device according to an exemplary embodiment of the present inventive concept.

FIG. 9 is a flowchart illustrating the method for programming a non-volatile memory device according to an exemplary embodiment of the present inventive concept. Referring to FIGS. 1 to 9, the non-volatile memory device 100 performs a programming operation to program a lower bit in a memory cell included in the non-volatile memory device 100 (S100).

The non-volatile memory device 100 reads the lower bit at least once before programming an upper bit in the memory cell (S110).

The non-volatile memory device 100 determines a threshold voltage (or threshold voltages) of the memory cell according to a result of the read (or an initial read) of the lower bit (S120).

The non-volatile memory device 100 determines whether the memory cell is the first type cell MC1 or the second type cell MC2 according to a result of the determination of the threshold voltage (S130). According to an exemplary embodiment of the present inventive concept, the first type cell MC1 may be a memory cell in which programming is inhibited, and the second type cell MC2 may be a memory cell in which bit line forcing is performed.

The non-volatile memory device 100 supplies one of a plurality of bit line forcing voltages (for example, the pulse PULSE) to a bit line connected to the memory cell according to a determined type of the memory cell. According to an exemplary embodiment of the present inventive concept, when the memory cell is the first type cell MC1, the non-volatile memory device 100 supplies the first pulse PULSE1 of the pulse PULSE to the bit line (S140), and when the memory cell is the second type cell MC2, the non-volatile memory device 100 supplies the second pulse PULSE2 of the pulse PULSE to the bit line (S150). As shown in FIG. 6, the first height H1 of the first pulse PULSE1 may be higher than the second height H2 of the second pulse PULSE2. According to an exemplary embodiment of the present inventive concept, the first height H1 of the first pulse PULSE1 may instead be lower than the second height H2 of the second pulse PULSE2.

Operations S100 to S150 may be performed before the non-volatile memory device 100 programs the upper bit in the memory cell (for example, a first loop).

In the method for programming a non-volatile memory device according to an exemplary embodiment of the present inventive concept, a type of a memory cell can be determined based on a threshold voltage of the memory cell and one pulse of a pulse sequence can be supplied to a bit line connected to the memory cell according to the determined type of the memory cell before an upper bit is programmed in the memory cell. Accordingly, a programming start voltage of the memory cell may be increased and programming performance of the non-volatile memory device may be increased.

For example, when the memory cell is programmed according to ISPP, the programming start voltage is increased, and accordingly, the number of program loops decreases. Thus, time consumed in the programming operation by the non-volatile memory device is reduced.

While the present inventive concept has been shown and described with reference to exemplary embodiments thereof, it will be understood by those of ordinary skill in the art that various changes in form and details may be made thereto without departing from the spirit and scope of the present inventive concept as defined by the following claims.

What is claimed is:

1. A method for programming a non-volatile memory device comprising:
   programming a lower bit in a memory cell included in the non-volatile memory device;
   reading the lower bit programmed in the memory cell before programming an upper bit in the memory cell;
   determining a threshold voltage of the memory cell according to a result of reading the lower bit;
   determining a type of the memory cell using the threshold voltage; and
   supplying one of a plurality of pulses to a bit line connected to the memory cell according to the determined type of the memory cell.

2. The method for programming a non-volatile memory device of claim 1, wherein reading the lower bit is performed at different time points using different read voltages.

3. The method for programming a non-volatile memory device of claim 1, further comprising programming the upper bit in the memory cell after one of the plurality of pulses is supplied to the bit line.

4. The method for programming a non-volatile memory device of claim 3, wherein the upper bit is programmed in the memory cell according to incremental step pulse programming (ISPP), and
   the upper bit is programmed in the memory cell before a programming start voltage, determined according to the ISPP, is supplied to the memory cell.

5. The method for programming a non-volatile memory device of claim 1, wherein heights of the plurality of pulses are different from one another.

6. The method for programming a non-volatile memory device of claim 5, wherein supplying one of the plurality of pulses comprises:
   supplying a first pulse among the plurality of pulses to the bit line when the determined type of the memory cell is a first type cell, and
   supplying a second pulse among the plurality of pulses is supplied to the bit line when the determined type of the memory cell is a second type cell,
   wherein the first pulse has a first height and the second pulse has a second height, and
   wherein a first threshold voltage of the first type cell is greater than a second threshold voltage of the second type cell and the first height is higher than the second height.

7. The method for programming a non-volatile memory device of claim 1, wherein the memory cell is a multi-level cell, the upper bit is a most significant bit (MSB), and the lower bit is a least significant bit (LSB).

8. The method for programming a non-volatile memory device of claim 7, wherein the lower bit is programmed as logical 1.

9. The method for programming a non-volatile memory device of claim 1, wherein the memory cell is a three-dimensional memory cell.

10. A method of operating a memory system including a controller and a non-volatile memory device configured to perform a programming operation according to a control of the controller, the method comprising:
    programming, by the non-volatile memory device, a lower bit in a memory cell included in the non-volatile memory device;
    reading, by the non-volatile memory device, the lower bit programmed in the memory cell before programming an upper bit in the memory cell;
    determining, by the non-volatile memory device, a threshold voltage of the memory cell according to a result of reading the lower bit;
    determining, by the non-volatile memory device, a type of the memory cell using the threshold voltage; and
    supplying, by the non-volatile memory device, one of a plurality of pulses to a bit line connected to the memory cell according to the determined type of the memory cell.

11. The method of operating a memory system of claim 10, further comprising programming, by the non-volatile memory device, the upper bit in the memory cell after one of the plurality of pulses is supplied to the bit line.

12. The method of operating a memory system of claim 11, wherein the upper bit is programmed in the memory cell according to incremental step pulse programming (ISPP), and
    the upper bit is programmed, by the non-volatile memory device, in the memory cell before a programming start voltage, determined according to the ISPP, is supplied to the memory cell.

13. The method of operating a memory system of claim 10, wherein heights of the plurality of pulses are different from one another.

14. The method of operating a memory system of claim 13,
    wherein supplying one of the plurality of pulses comprises:
    supplying, by the non-volatile memory device, a first pulse among the plurality of pulses to the bit line when the determined type of the memory cell is a first type cell, and
    supplying, by the non-volatile memory device, a second pulse among the plurality of pulses to the bit line when the determined type of the memory cell is a second type cell,
    wherein the first pulse has a first height and the second pulse has a second height, and
    wherein a first threshold voltage of the first type cell is greater than a second threshold voltage of the second type cell and the first height is higher than the second height.

15. The method of operating a memory system of claim 10, wherein the memory cell is a multi-level cell, the upper bit is a most significant bit (MSB), and the lower bit is a least significant bit (LSB).

16. A method for programming a non-volatile memory device comprising:
    programming a lower bit in a memory cell included in the non-volatile memory device;
    reading the lower bit programmed in the memory cell before programming an upper bit in the memory cell;
    determining a threshold voltage of the memory cell according to a result of reading the lower bit;
    determining whether the memory cell is one of a first type cell, a second type cell, or a third type cell using the threshold voltage;

transmitting a pulse sequence comprising a first pulse, a second pulse, and a third pulse; and supplying, to a bit line connected to the memory cell, the first pulse if the memory cell is the first type cell, the second pulse if the memory cell is the second type cell, and the third pulse if the memory cell is the third type cell, wherein a first threshold voltage of the first type cell is higher than a second threshold voltage of the second type cell, and the second threshold voltage of the second type cell is higher than a third threshold voltage of the third type cell.

17. The method of claim 16, further comprising:

programming the upper bit of the memory cell after supplying one of the first pulse, the second pulse, or the third pulse to the bit line connected to the memory cell.

18. The method of claim 16, wherein a first height of the first pulse is greater than a second height of the second pulse, and the second height of the second pulse is greater than a third height of the third pulse.

19. The method of claim 18, wherein the first height of the first pulse is substantially the same as a level of a power voltage, and the third height of the third pulse is greater than a level of a ground voltage.

20. The method of claim 16, wherein the memory cell is connected to a string selection transistor of the bit line, the string selection transistor is turned off when the first pulse is supplied, and the string selection transistor is turned on when the second pulse or the third pulse is supplied.

* * * * *